United States Patent
Bohn et al.

(10) Patent No.: US 9,324,017 B2
(45) Date of Patent: Apr. 26, 2016

(54) CHIP MODULE FOR AN RFID SYSTEM

(75) Inventors: Martin Bohn, Reutlingen (DE); Harry Nitschko, Wolfsschlugen (DE); Kai Schaffrath, Eningen (DE)

(73) Assignee: BIELOMATIKLEUZE GMBH & CO. KG, Neuffen (DE)

( * ) Notice: Subject to any disclaimer, the term of this patent is extended or adjusted under 35 U.S.C. 154(b) by 733 days.

(21) Appl. No.: 12/513,681

(22) PCT Filed: Oct. 16, 2007

(86) PCT No.: PCT/EP2007/008948
§ 371 (c)(1),
(2), (4) Date: May 6, 2009

(87) PCT Pub. No.: WO2008/055579
PCT Pub. Date: May 15, 2008

(65) Prior Publication Data
US 2010/0032487 A1    Feb. 11, 2010

(30) Foreign Application Priority Data
Nov. 6, 2006  (DE) .......................... 10 2006 052 517

(51) Int. Cl.
*G06K 19/077* (2006.01)
*G06K 19/04* (2006.01)
*H01L 23/498* (2006.01)
*H01Q 1/22* (2006.01)

(52) U.S. Cl.
CPC .......... *G06K 19/07749* (2013.01); *G06K 19/04* (2013.01); *G06K 19/077* (2013.01); *G06K 19/07756* (2013.01); *H01Q 1/2225* (2013.01); *H01L 23/49855* (2013.01); *H01L 2924/0002* (2013.01)

(58) Field of Classification Search
CPC ................ G06K 19/077; G06K 19/04; G06K 19/07749; G06K 19/0775; G06K 19/0776; G06K 19/07766; G06K 19/07767; G06K 19/07773; G06K 19/07783; G06K 19/07794; G06K 19/07756; H01Q 1/2225; H01L 23/49855; H01L 2924/0002
See application file for complete search history.

(56) References Cited

U.S. PATENT DOCUMENTS

| | | | |
|---|---|---|---|
| 6,107,920 A * | 8/2000 | Eberhardt | B65D 5/4233 257/673 |
| 6,140,146 A | 10/2000 | Brady et al. | 438/62 |
| 6,378,774 B1 | 4/2002 | Emori et al. | 235/492 |
| 6,390,375 B2 * | 5/2002 | Kayanakis | 235/492 |
| 7,265,674 B2 * | 9/2007 | Tuttle | G01S 13/758 235/380 |
| 7,391,325 B2 * | 6/2008 | Cobianu et al. | 340/572.1 |
| 7,400,298 B2 * | 7/2008 | Fogg et al. | 343/700 MS |
| 7,557,757 B2 * | 7/2009 | Deavours et al. | 343/700 MS |
| 7,808,384 B2 * | 10/2010 | Stobbe et al. | 340/572.1 |
| 2002/0036237 A1 * | 3/2002 | Atherton et al. | 235/492 |
| 2002/0135481 A1 * | 9/2002 | Conwell et al. | 340/572.1 |

(Continued)

FOREIGN PATENT DOCUMENTS

WO    WO 2004055721    7/2004

*Primary Examiner* — Daniel Walsh
(74) *Attorney, Agent, or Firm* — Andrew Wilford

(57) ABSTRACT

The invention relates to a chip module for an RFID system, in particular for an RFID-label, a coupling label for use in an RFID-label, an RFID-Inlay for an RFID-label, and an RFID label produced using an RFID inlay on a strip-shaped backing material (5, 8), in particular a backing film; an RFID chip (3) and a coupling antenna (4) that is electrically, in particular galvanically, connected to the RFID-chip (3), are arranged on the strip-shaped backing material.

1 Claim, 2 Drawing Sheets

(56) References Cited

U.S. PATENT DOCUMENTS

| | | | |
|---|---|---|---|
| 2003/0136503 A1* | 7/2003 | Green et al. ................. 156/264 |
| 2004/0001000 A1* | 1/2004 | Redlin ....................... 340/572.8 |
| 2004/0125040 A1* | 7/2004 | Ferguson ......... G06K 19/07749 343/895 |
| 2004/0215350 A1* | 10/2004 | Roesner ........................... 700/1 |
| 2005/0045723 A1* | 3/2005 | Tsirline et al. ................ 235/451 |
| 2005/0200539 A1* | 9/2005 | Forster ............. G06K 19/07749 343/749 |
| 2005/0242950 A1 | 11/2005 | Lindsay et al. ......... 340/539.26 |
| 2005/0242957 A1* | 11/2005 | Lindsay ............. G06K 19/0716 340/572.7 |
| 2006/0000915 A1* | 1/2006 | Kodukula et al. ............. 235/492 |
| 2006/0012482 A1* | 1/2006 | Zalud et al. ................ 340/572.7 |
| 2006/0043198 A1* | 3/2006 | Forster ........................ 235/492 |
| 2006/0044769 A1* | 3/2006 | Forster et al. ................. 361/760 |
| 2006/0055541 A1* | 3/2006 | Bleckmann ................ 340/572.7 |
| 2006/0145860 A1* | 7/2006 | Brown et al. .............. 340/572.7 |
| 2006/0163368 A1* | 7/2006 | Fogg et al. .................... 235/492 |
| 2006/0186204 A1* | 8/2006 | Lubow ............. G06K 19/06009 235/462.01 |
| 2006/0238989 A1* | 10/2006 | Manes ............. G06K 19/07749 361/760 |
| 2007/0029384 A1* | 2/2007 | Atherton ....................... 235/435 |
| 2007/0040686 A1* | 2/2007 | Reis ........................... 340/572.7 |
| 2007/0052613 A1* | 3/2007 | Gallschuetz et al. ......... 343/860 |
| 2007/0146135 A1* | 6/2007 | Boyadjieff et al. ........ 340/572.1 |
| 2007/0164859 A1* | 7/2007 | Cobianu et al. .......... 340/539.26 |
| 2007/0194935 A1* | 8/2007 | Ayala et al. ................. 340/572.8 |
| 2007/0194993 A1* | 8/2007 | Deavours et al. ....... 343/700 MS |
| 2007/0210924 A1* | 9/2007 | Arnold ................... B31D 1/021 340/572.8 |
| 2008/0012709 A1* | 1/2008 | Stobbe et al. .............. 340/572.1 |
| 2008/0035741 A1* | 2/2008 | Sakama ........... G06K 19/07749 235/492 |
| 2008/0072423 A1* | 3/2008 | Finn .............................. 29/854 |
| 2008/0117056 A1* | 5/2008 | Forster ............. G06K 19/07752 340/572.7 |
| 2008/0150719 A1* | 6/2008 | Cote ................... G06K 19/0723 340/572.1 |
| 2008/0150817 A1* | 6/2008 | Carre et al. .................... 343/741 |
| 2008/0295318 A1 | 12/2008 | Bohn .............................. 29/601 |
| 2008/0308641 A1* | 12/2008 | Finn .............................. 235/492 |
| 2009/0040734 A1* | 2/2009 | Ochi .................. G06K 19/0723 361/737 |
| 2009/0249611 A1* | 10/2009 | Hanhikorpi et al. ............. 29/601 |
| 2009/0277516 A1* | 11/2009 | Winkler et al. ................ 137/486 |
| 2010/0032487 A1* | 2/2010 | Bohn ................. G06K 19/0723 235/492 |
| 2010/0097280 A1* | 4/2010 | Zirbes et al. .................. 343/726 |
| 2010/0109961 A1* | 5/2010 | Surkau .......................... 343/767 |
| 2010/0134294 A1* | 6/2010 | Rexer ............. G06K 19/07749 340/572.8 |
| 2010/0187316 A1* | 7/2010 | Bohn ............................ 235/488 |
| 2011/0169146 A1* | 7/2011 | Ohira ............... G06K 19/07728 257/666 |

* cited by examiner

CHIP MODULE FOR AN RFID SYSTEM

CROSS REFERENCE TO RELATED APPLICATIONS

This application is the US national stage of PCT application PCT/EP2007/008948, filed 16 Oct. 2007, published 15 May 2008 as WO2008/055579, and claiming the priority of German patent application 102006052517.5 itself filed 6 Nov. 2006, whose entire disclosures are herewith incorporated by reference.

FIELD OF THE INVENTION

The invention relates to a chip module for an RFID system, in particular for an RFID label, a coupling label for use in an RFID label, an RFID inlay for an RFID label, and an RFID label (smart label) produced using an RFID inlay.

BACKGROUND OF THE INVENTION

In the production of RFID labels, as is known, chip modules are used which have an RFID microchip and electrical connecting contacts, by which they are connected to the RFID antenna. WO 2005/076206 [US 2008/0295318] describes a continuous production method for RFID labels, during which the chip modules, with their back face facing away from the connecting contacts, are placed on adhesive film sections whose base area is significantly larger than a base area of each chip module. The electrical connecting contacts of the chip modules are electrically contacted by the antenna connections, the adhesive film sections being flatly joined to the antenna film sections in such a manner that the chip modules are fixed relative to the antenna connections.

As is known, RFID labels are produced in a manner that a so-called RFID inlay is mounted between a cover strip provided with a pressure-sensitive adhesive layer on its lower face and a backing strip that can be removed from the pressure-sensitive adhesive layer. The RFID inlay includes an RFID chip attached to a flat antenna and galvanically connected thereto, the RFID antenna being mounted on an antenna film.

It is known to attach the chip modules for processing successively in a row on a strip and to deliver them in this manner during processing to the RFID antennas. Each microchip, with its two contacts, is then removed from the strip and glued onto the RFID antenna in such a manner that its connecting contacts have galvanic contact with the contacts of the RFID antenna.

During this step, one has to position the chip modules very accurately on the RFID antenna so that the galvanic contact is established.

OBJECT OF THE INVENTION

The invention is hence based on the object of providing a chip module that is brought into contact with the RFID antenna in a simplified manner.

SUMMARY OF THE INVENTION

According to the invention, this object is attained in that an RFID chip and a coupling antenna that is electrically, in particular galvanically, connected to the RFID chip, are mounted on a backing sheet or strip, in particular on a backing film.

The coupling antenna allows establishing an inductive connection with the RFID antennas. An inductive connection can be produced in a simplified manner by an appropriate design of the coupling antenna and the RFID antenna without the need of both of them being positioned very accurately with respect to each other, in particular, when the coupling region of the RFID antenna is wider than the coupling region of the coupling antenna. The chip module can be glued onto the respective area of the RFID antenna with a defined spacing determined by the thickness of the backing film and the pressure-sensitive adhesive layer.

A further advantage is that the RFID chip can be mounted on the coupling antenna in a simplified manner without complex connecting contacts for the subsequent connection with the RFID antenna being required.

The RFID antenna can advantageously be produced as a flat, for example, edged or printed antenna made of the usual antenna materials, and is advantageously mounted on a backing film, in particular, an adhesive material.

The chip module according to the invention can advantageously be used to make a so-called coupling label that is used in the subsequent production of RFID systems, in particular RFID labels, tags, or tickets. In case of a coupling label, the lower face of the backing film of a chip module has an adhesive layer covered by a removable separating strip or sheet.

The coupling labels can advantageously be produced in strips with a plurality of chip modules arrayed in a row and spaced apart from one another. During the production of RFID systems, they are fed in this manner on strips in respective RFID antennas and are either attached in strip form on the antennas, which are provided in strips as well, or they are cut from the strip and glued individually onto respective antennas.

If the coupling labels are used for the production of RFID labels, preferably first a so-called RFID inlay is produced. The RFID inlay consists of a flat RFID antenna that is preferably provided on an antenna film, and onto which a chip module according to the invention is glued with its backing film in such a position that the coupling antenna and the RFID antenna are inductively coupled. Preferably the antenna film has on its rear face a pressure-sensitive adhesive layer covered by a separating material. The RFID label is then produced in such a manner that an RFID inlay is provided according to the invention between a cover strip or sheet provided with a pressure-sensitive adhesive layer on its lower face and a separating strip or sheet that can be removed from the adhesive layer to expose the same for the adhesive bonding of the label. The cover can be printed on its upper face or can be graphically formed in a different way.

The chip module according to the invention can preferably be used in other RFID systems as well. Thus, the coupling label can be glued onto an RFID antenna that has been applied, for example printed, onto a package. The coupling antenna is then inductively coupled with the RFID antenna of the package (smart box).

BRIEF DESCRIPTION OF THE DRAWING

Hereinafter, the invention is described in more detail by an embodiment illustrated in a simplified manner.

DETAILED DESCRIPTION

Figure 1:
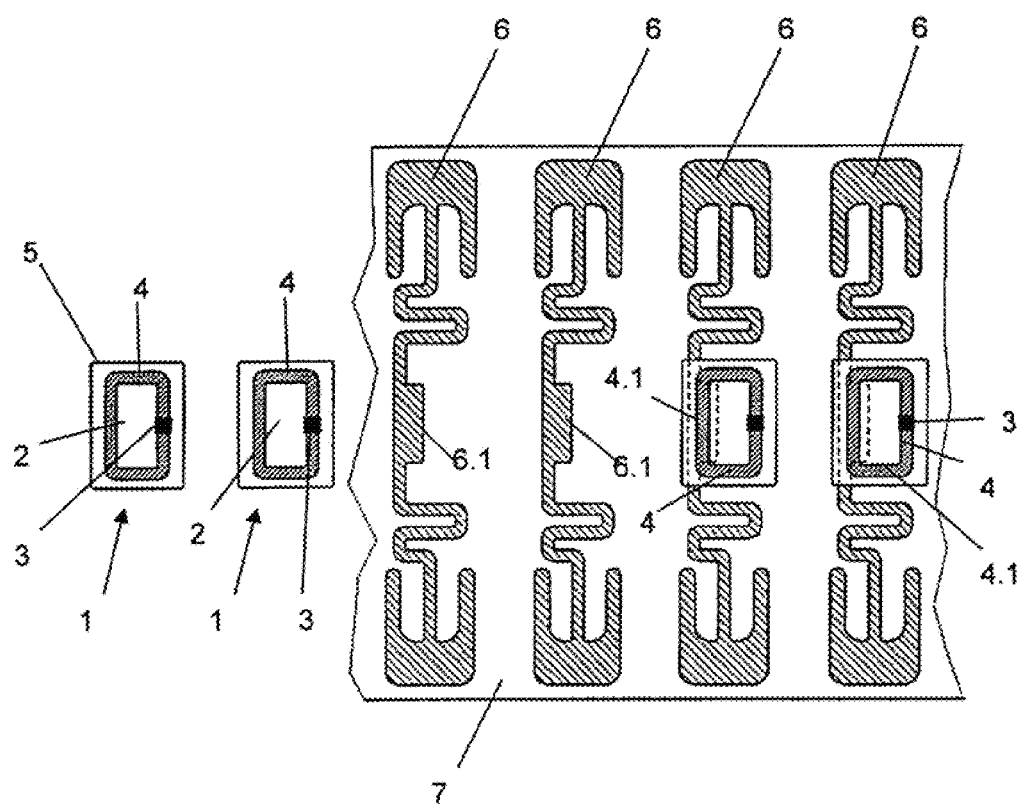
FIG. 1 shows a single coupling label with a chip module, respectively and its positioning on antennas for producing RFID inlays.
Figure 2:
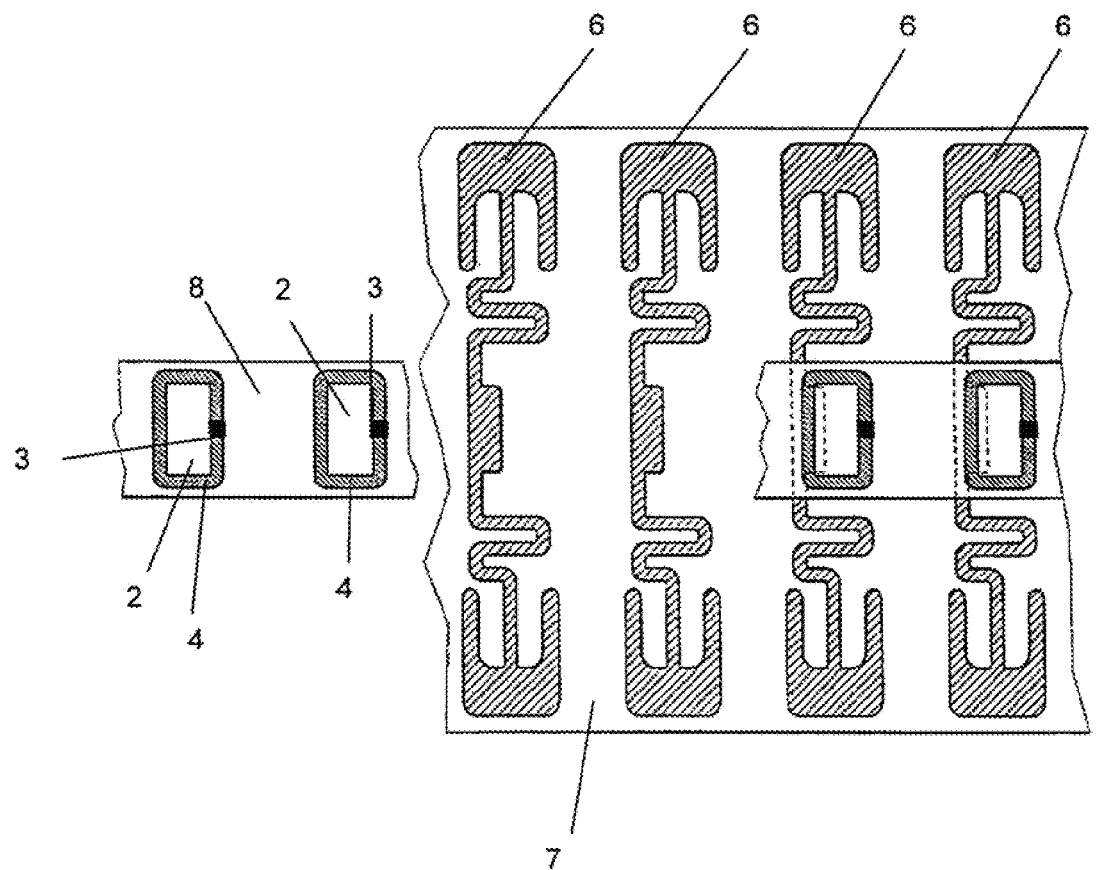
FIG. 2 shows RFID inlays to which coupling labels in strip form are fed.

In FIG. 1, two coupling labels 1 are shown, each including one chip module 2 with one RFID chip 3. The RFID chip 3 is mounted on a coupling antenna 4 and is electrically, in particular galvanically, connected with it. The coupling antenna 4 with the RFID chip 3 is mounted on a backing strip or sheet, in particular a backing film 5. As shown in the FIGS. 1 to 3, the RFID chip 3 is preferably directly attached to the flat coupling antenna 4 and is galvanically connected therewith. To create a self-adhesive coupling element, the lower face of the backing film 5 of a chip module 2 has an adhesive layer 9 covered by a removable separating strip or sheet 11. The coupling label 1 can be glued in this manner onto an RFID antenna 6 after removal of the separating layer 11. In so doing, the bonded coupling antenna 4 is placed at a precisely defined spacing from the RFID antenna 6. The spacing is selected such that the coupling antenna 4 and the RFID antenna 6 are inductively coupled. The spacing can be accurately adjusted by the thickness of the backing film and its adhesive layer 9. Preferably, each RFID antenna 6 is mounted on an antenna film 7. As shown in FIGS. 1 and 2, a plurality of RFID antennas 6 are advantageously arrayed spaced apart from one another on the strip-shaped antenna film 7 to produce RFID inlays that are connected with one another and that can be fed to a subsequent processing step.

Preferably, a coupling region 6.1 (FIG. 1) of the RFID antenna 6 is wider than a coupling region 4.1 of the coupling antenna 4. This way, some clearance is provided to position the coupling region 4.1 of the coupling antenna 4 onto the coupling region 6.1 of the RFID antenna 6. In this manner, clearance is provided during the production of the RFID inlays for positioning the coupling labels 1 on the antennas 6.

In the procedure shown in FIG. 1, each of the coupling labels 1 with their chip modules 2 is fed individually to the RFID antennas 6. After removing the respective separating film on the lower face, the adhesive layer 9 of the backing film 5 is exposed, and one chip module 2 is glued onto each RFID antenna 6.

It is also possible as also shown in FIG. 2 to array a row of chip modules 2 spaced apart from one another on a strip-shaped backing film 8. The spacing of the chip modules 2 relative to one another corresponds here to the spacing between the RFID antennas 6 on their backing film 7. After removing the separating material from the lower face, the adhesive layer of the backing film 8 is exposed, and the chip modules 2 are continuously glued onto the antennas 6 while still mounted on a common backing film 8. The separation into individual RFID inlays takes place subsequently by cross cuts between the individual antennas 6, wherein in the procedure according to FIG. 1, only the antenna film 7 is cut through. In the procedure according to FIG. 2, the antenna film 7 and the backing film 8 are each time cut through together.

The RFID antenna 6 can also be an antenna, in particular a printed antenna that is placed directly onto a package, for example a folded box, onto which antenna the coupling label 1 is glued (smart box).

Figure 3:
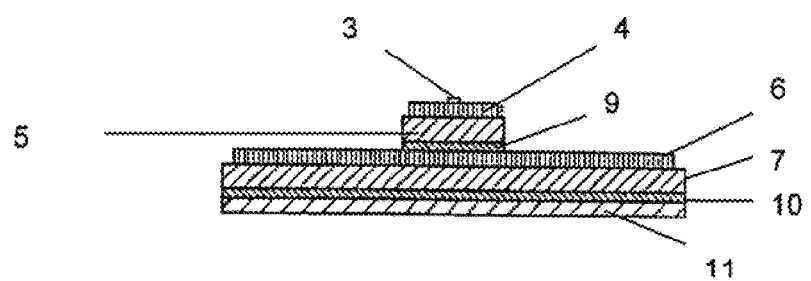
FIG. 3 shows a cross-section of an RFID inlay.

The structure of the RFID inlay according to the invention is clearly illustrated in FIG. 3: The RFID chip 3 is directly attached to the coupling antenna 4. The coupling antenna 4 is located on the upper face of the backing material 5 that has an adhesive layer 9 on its lower face. The backing material 5, with the coupling antenna and the chip 3 mounted thereon, is glued by the adhesive layer 9 onto the RFID antenna 6. Depending on the intended use, the RFID antenna 6 is a HF or an UHF antenna. The RFID antenna 6 is attached to the upper face of the antenna film 7, and on its lower face the antenna film 7 has a pressure-sensitive adhesive layer 10 covered by a removable separating layer 11, for example of silicone.

For the production of an RFID label, the RFID inlay illustrated in FIG. 3 is provided between a cover strip or sheet and a similar backing strip or sheet. The cover, which is usually printed on its upper face, has on its lower face a pressure-sensitive adhesive layer onto which the backing is removably glued. For inserting the RFID inlay between the cover and the backing of the label, the backing is lifted-off and reapplied after bonding of the RFID inlay onto the pressure-sensitive adhesive layer. Prior to that, the separating material 11 of the RFID inlay is removed so that underneath the backing material of the RFID label, which for example consists of silicone paper, a continuous adhesive layer is present. The RFID label configured in this manner can be glued onto goods or a package after removing the backing material.

The invention claimed is:

1. An RFID label comprising:
   a cover sheet having an upper face and a lower face;
   an RFID chip;
   a coupling antenna bonded between the RFID chip and the upper face of the cover sheet and having a coupling region;
   an antenna film having an upper face and a lower face;
   a pressure-sensitive adhesive layer on the lower face of the cover sheet;
   a flat RFID antenna bonded by the pressure-sensitive adhesive layer to the lower face of the cover sheet and having a coupling region fixed to the upper face of the antenna film at the coupling region thereof, the coupling region of the RFID antenna being wider than the coupling region of the coupling antenna;
   a pressure-sensitive adhesive layer on the lower face of the antenna film; and
   a separating sheet secured to the pressure-sensitive adhesive layer of the antenna film.

* * * * *